United States Patent
Kim

(10) Patent No.: US 7,304,891 B2
(45) Date of Patent: Dec. 4, 2007

(54) APPARATUS AND METHOD FOR IMPROVING WRITE/READ ENDURANCE OF NON-VOLATILE MEMORY

(75) Inventor: Min-Kyu Kim, Seognam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/447,544

(22) Filed: Jun. 6, 2006

(65) Prior Publication Data

US 2007/0019473 A1 Jan. 25, 2007

(30) Foreign Application Priority Data

Jul. 23, 2005 (KR) ...................... 10-2005-0067059

(51) Int. Cl.
*G11C 11/34* (2006.01)

(52) U.S. Cl. ............................. 365/185.18; 365/185.09

(58) Field of Classification Search ............ 365/185.02
See application file for complete search history.

(56) References Cited

U.S. PATENT DOCUMENTS

| 4,718,041 A | * | 1/1988 | Baglee et al. | .......... 365/185.22 |
| 5,450,354 A | * | 9/1995 | Sawada et al. | ........ 365/185.24 |
| 6,052,306 A | * | 4/2000 | Sedlak et al. | .......... 365/185.19 |

FOREIGN PATENT DOCUMENTS

| JP | 00057785 | 2/2000 |
| JP | 00348491 | 12/2000 |
| JP | 02133887 | 5/2002 |

OTHER PUBLICATIONS

English Abstract for Publication No.: 2000-057785, Feb. 2000.
English Abstract for Publication No.: 2000-348491, Dec. 2000.
English Abstract for Publication No.: 2002-133887, May 2002.
Notice to Submit Response to an Office Action.
English Translation of the Office Action.

* cited by examiner

*Primary Examiner*—Tan T. Nguyen
(74) *Attorney, Agent, or Firm*—F. Chau & Associates, LLC

(57) ABSTRACT

An apparatus for improving write/read endurance of non-volatile memory includes a non-volatile memory area including a plurality of non-volatile memory cells to store data, and an endurance improving circuit detecting a degradation characteristic of the non-volatile memory cells upon the integrated circuit card being reset and initialized. The apparatus increases at least one of a write voltage used to write first data to the non-volatile memory cells and a read voltage used to read second data from the non-volatile memory cells based on a detection result. A method for improving write/read endurance of non-volatile memory includes monitoring the characteristic of non-volatile memory cells upon an integrated circuit card being reset and initialized, and increasing at least one among a write voltage and a read voltage which are applied to the non-volatile memory cells based on a monitoring result.

16 Claims, 9 Drawing Sheets

APPARATUS AND METHOD FOR IMPROVING WRITE/READ ENDURANCE OF NON-VOLATILE MEMORY

CROSS-REFERENCE TO RELATED PATENT APPLICATIONS

This application claims the benefit of Korean Patent Application No. 10-2005-0067059, filed on Jul. 23, 2005, in the Korean Intellectual Property Office, the disclosure of which is herein incorporated by reference in its entirety.

BACKGROUND OF THE INVENTION

1. Field of the Invention

The present invention relates to an apparatus and method for improving read endurance of non-volatile memory, and more particularly, to an apparatus and method for improving read endurance of non-volatile memory by increasing a write voltage and/or a read voltage in a system on chip (SOC) including the non-volatile memory.

2. Description of Related Art

Non-volatile memory cells, and particularly electrically erasable programmable read-only memory (EEPROM) cells, have a read endurance of less than 500,000 write/read cycles or updates. The read endurance is the ability of an EEPROM cell to maintain a write/read time or speed within a predetermined range when data is written to or read from the EEPROM cell. When a threshold voltage of the EEPROM cell decreases, current flowing in the EEPROM cell increases. As the current flowing in the EEPROM cell increases, time taken to read data from the EEPROM cell increases and read speed decreases. The number of updates performed before the read speed decreases outside the predetermined range may be expressed as the read endurance.

FIG. 1 illustrates the number of updates versus the threshold voltage in an EEPROM cell. Referring to FIG. 1, when the number of updates, or read/write cycles, in the EEPROM cell increases in a program state, the threshold voltage of the EEPROM cell increases. As the threshold voltage of the EEPROM cell increases, current in the EEPROM cell occurring when data stored in the EEPROM cell is read decreases.

Accordingly, as the EEPROM cell is repeatedly updated, read time increases and read speed decreases.

Therefore, a need exists for an apparatus and method for improving read endurance of non-volatile memory.

SUMMARY OF THE INVENTION

According to an embodiment of the present invention, an integrated circuit card which monitors a characteristic of non-volatile memory cells upon the integrated circuit card being reset and initialized and increases at least one of a write voltage and a read voltage, which are applied to the non-volatile memory cells based on a monitoring result.

According to another embodiment of the present invention, an integrated circuit card includes a non-volatile memory area including a plurality of non-volatile memory cells to store data, and an endurance improving circuit detecting a characteristic of the non-volatile memory cells upon the integrated circuit card being reset and initialized and maintaining or increasing at least one of a write voltage used to write first data to the non-volatile memory cells and a read voltage used to read second data from the non-volatile memory cells based on a detection result.

The endurance improving circuit may include a voltage generation circuit generating at least one of the write voltage used to write the first data to the non-volatile memory cells in response to a write voltage control signal and the read voltage used to read the second data from the non-volatile memory cells in response to a read voltage control signal, and a voltage control circuit detecting the characteristic of the non-volatile memory cells and outputting at least one of the write voltage control signal and the read voltage control signal based on the detection result.

The voltage generation circuit may include a write voltage pump generating a first plurality of voltages and outputting one voltage of the first plurality of voltages as the write voltage according to the write voltage control signal, and a read voltage pump generating a second plurality of voltages and outputting one voltage of the second plurality of voltages as the read voltage according to the read voltage control signal.

The voltage control circuit may include a write/read voltage information storage area storing information on the write voltage and information on the read voltage, a first information storage area storing first information indicating the characteristic of first non-volatile memory, an endurance information storage area including a second non-volatile memory to which the first information is written upon the integrated circuit card being initialized, and a controller generating at least one of the write voltage control signal and the read voltage control signal based on at least one of the information on the write voltage and the information on the read voltage, wherein the controller compares the characteristic indicated by the first information read from the first information storage area in response to the read voltage with the characteristic indicated by the first information read from the endurance information storage area in response to the read voltage and maintains or updates at least one of the information on the write voltage and the information on the read voltage based on a comparison result.

Alternatively, the voltage control circuit may include a write/read voltage information storage area storing information on the write voltage and information on the read voltage, a controller storing first information indicating a characteristic of first non-volatile memory and generating the write voltage control signal and/or the read voltage control signal based on the information on the write voltage and/or the information on the read voltage, and an endurance information storage area including second non-volatile memory to which the first information is written whenever the integrated circuit card is initialized, wherein the controller compares the characteristic indicated by the first information indicating the characteristic of the first non-volatile memory with the characteristic indicated by the first information read from the endurance information storage area in response to the read voltage and maintains or updates at least one of the information on the write voltage and the information on the read voltage based on a comparison result.

According to still another embodiment of the present invention, an integrated circuit card includes a non-volatile memory area including a plurality of non-volatile memory cells to store data; and an endurance improving circuit receiving first information indicating an initial state of the plurality of non-volatile memory cells, receiving second information indicating a state of the non-volatile memory cells upon the integrated circuit card being reset and initialized, comparing the first information with the second information, and maintaining or increasing at least one of a write voltage and a read voltage, which are applied to the non-volatile memory area based on a comparison result.

According to yet another embodiment of the present invention, a method of improving write/read endurance of non-volatile memory in a system on chip including the non-volatile memory includes receiving first information indicating a characteristic of first non-volatile memory that has not been degraded and second information indicating a characteristic of second non-volatile memory that has been degraded due to one of a write operation and a read operation executed in response to a write voltage or a read voltage, respectively, and comparing the first information with the second information; and increasing at least one voltage of the write voltage and the read voltage based on a comparison result.

According to a further embodiment of the present invention, a method of improving write/read endurance of non-volatile memory in an integrated circuit card including the non-volatile memory includes storing first information in a first area of the non-volatile memory, reading at least one of information on a write voltage and information on a read voltage, and generating at least one voltage of the read voltage and the write voltage based on the at least one of the information on the write voltage and the information on the read voltage. The method further includes reading the first information from the first area using the read voltage, writing the first information to a second area of the non-volatile memory in response to the write voltage upon the integrated circuit card being initialized, reading the first information from the second area in response to the read voltage, comparing a characteristic indicated by the first information from the first area with the characteristic indicated by the first information from the second area, and changing at least one of the information on the write voltage and the information on the read voltage based on a comparison result.

BRIEF DESCRIPTION OF THE DRAWINGS

The present invention will become more apparent by describing in detail exemplary embodiments thereof with reference to the attached drawings in which.

DETAILED DESCRIPTION OF PREFERRED EMBODIMENTS

Figure 1:
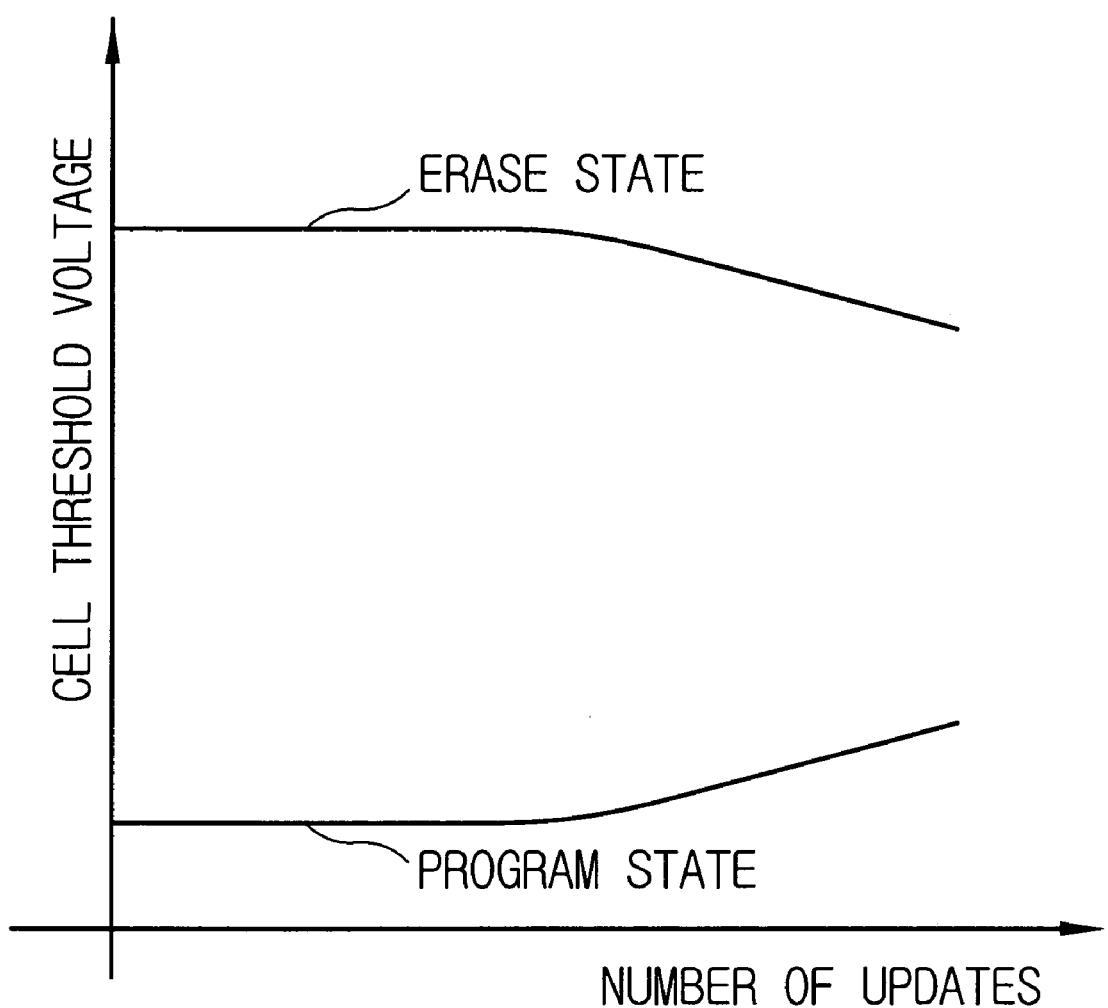
FIG. 1 illustrates the number of updates versus the threshold voltage in a conventional electrically erasable programmable read-only memory (EEPROM) cell.
Figure 2:
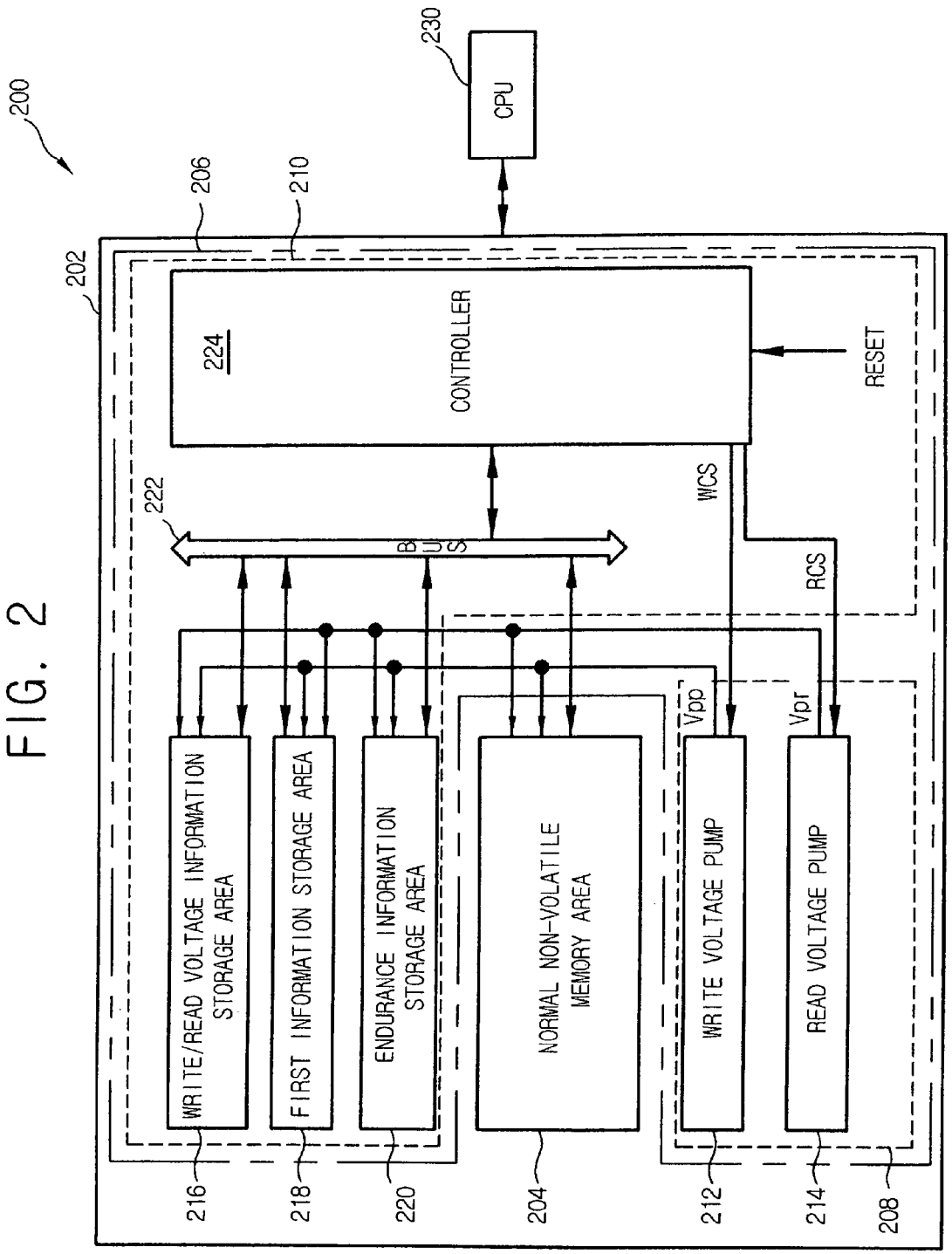
FIG. 2 is a block diagram of a system on chip (SOC) including an EEPROM cell, according to an embodiment of the present invention.

FIG. 2 is a block diagram of a system on chip (SOC) including an electrically erasable programmable read-only memory (EEPROM) cell according to an embodiment of the present invention. The SOC including at least one EEPROM cell is a mobile information storage system such as an integrated circuit card or a smart card but is not restricted thereto.

Referring to FIG. 2, the SOC, e.g., the integrated circuit card 200 includes a non-volatile memory apparatus 202 and a central processing unit (CPU) 230. The non-volatile memory apparatus 202 includes a normal non-volatile memory area 204 and an endurance improving circuit 206. The integrated circuit card 200 may additionally include random access memory (RAM), read-only memory (ROM), and other peripheral circuits (not shown).

The CPU 230 executes an operating system (OS) program. The RAM may store data generated when the CPU 230 executes the OS program. The ROM may store the OS program and other programs.

The normal non-volatile memory area 204 in the non-volatile memory apparatus 202 stores diverse application programs and specified data controlled by the CPU 230 and includes a plurality of non-volatile memory cells. The specified data is updated through erase and program operations. The non-volatile memory cells may be implemented as EEPROM cells, but is not restricted thereto.

The endurance improving circuit 206 monitors the non-volatile memory cells of the normal non-volatile memory area 204 when the integrated circuit card 200 is initialized through a reset operation and maintains or increases at least one of a write voltage Vpp and a read voltage Vpr. The write voltage Vpp is used to write data to the non-volatile memory cells and the read voltage Vpr is used to read data from the non-volatile memory cells based on a monitoring result. The endurance improving circuit 206 includes a voltage generation circuit 208 and a voltage control circuit 210.

The voltage generation circuit 208 generates the write voltage Vpp to write data to the non-volatile memory cells of areas 204, 216, 218, and 220 in response to a write voltage control signal WCS. The voltage generation circuit 208 generates the read voltage Vpr to read data from the non-volatile memory cells of the areas 204, 216, 218, and 220 in response to a read voltage control signal RCS.

Figure 3:
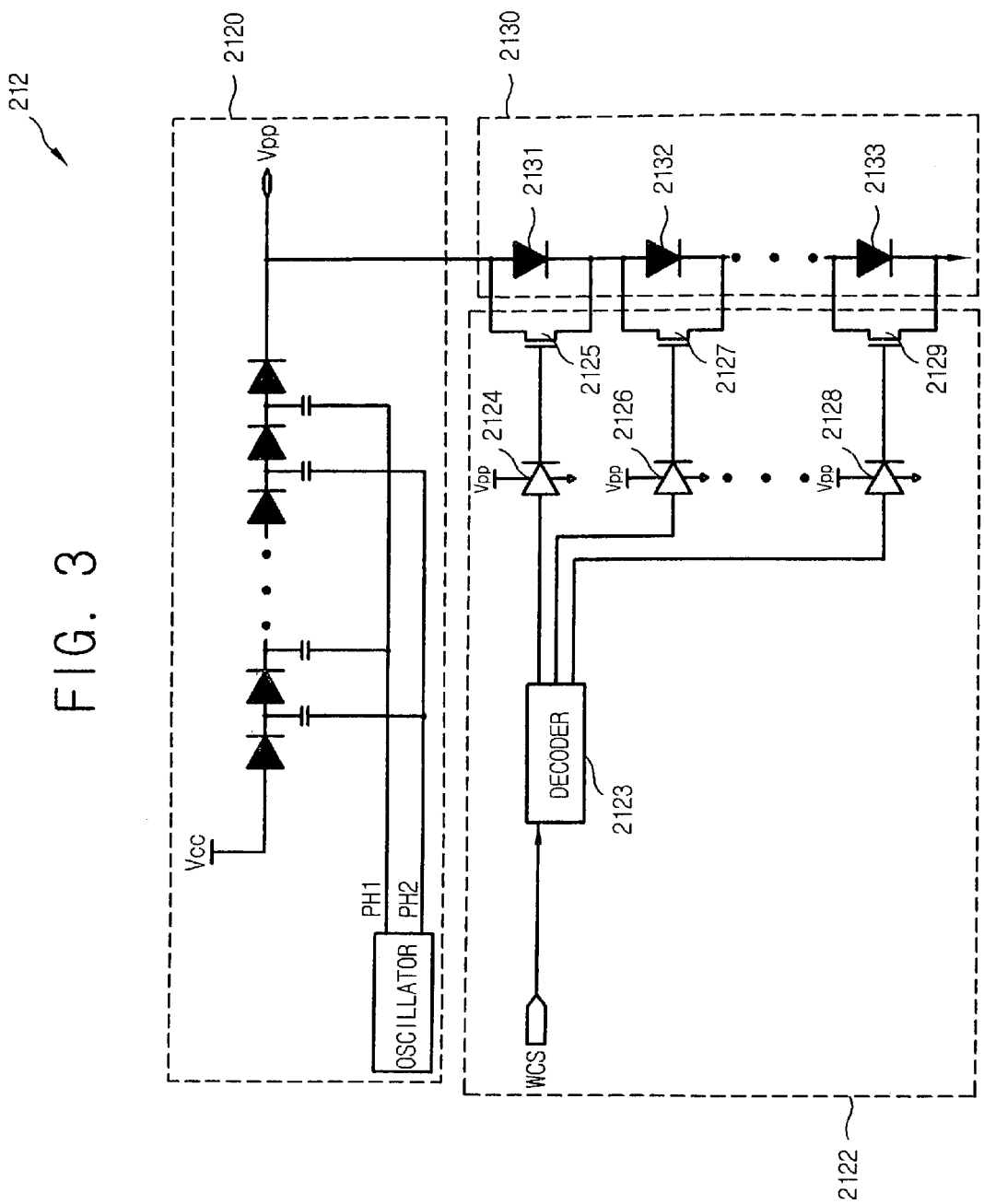
FIG. 3 is a circuit diagram of a write voltage pump shown in FIG. 2.

The voltage generation circuit 208 includes a write voltage pump 212 and a read voltage pump 214. FIG. 3 is a circuit diagram of the write voltage pump 212 shown in FIG. 2. Referring to FIG. 3, the write voltage pump 212 includes a pumping circuit 2120, a level control signal generation circuit 2122, and a write voltage level control circuit 2130.

The pumping circuit 2120 includes an oscillator, a plurality of diodes connected in series, and a plurality of capacitors. The oscillator outputs a signal PH1 having a first phase through a first output terminal and outputs a signal PH2 having a second phase through a second output terminal. A difference between the first and second phases may be 180°.

A plurality of capacitors is connected between the first output terminal of the oscillator and output terminals of odd-numbered diodes, respectively. A plurality of capacitors is connected between the second output terminal of the oscillator and output terminals of even-numbered diodes, respectively. The pumping circuit 2120 pumps a power supply voltage Vcc to generate the write voltage Vpp higher than the power supply voltage Vcc.

The level control signal generation circuit 2122 generates control signals to turn switches on or off, e.g., transistors 2125, 2127, and 2129, respectively, in response to the write voltage control signal WCS. In detail, a decoder 2123 decodes the write voltage control signal WCS and outputs decoded signals. Each of buffers 2124, 2126, and 2128 outputs a signal having the level of the write voltage Vpp or the level of a ground voltage (VSS) in response to a corresponding output signal from the decoder 2123. The transistors 2125, 2127, and 2129 are turned on or off in response to output signals from the corresponding buffers 2124, 2126, and 2128, respectively.

The write voltage level control circuit 2130 includes a plurality of diodes, e.g., 2131 through 2133, connected in series. The diodes control the level of the write voltage Vpp with the corresponding transistors 2125, 2127, and 2129 that are turned on or off in response to the output signals from the buffers 2124, 2126, and 2128, respectively.

Figure 4:
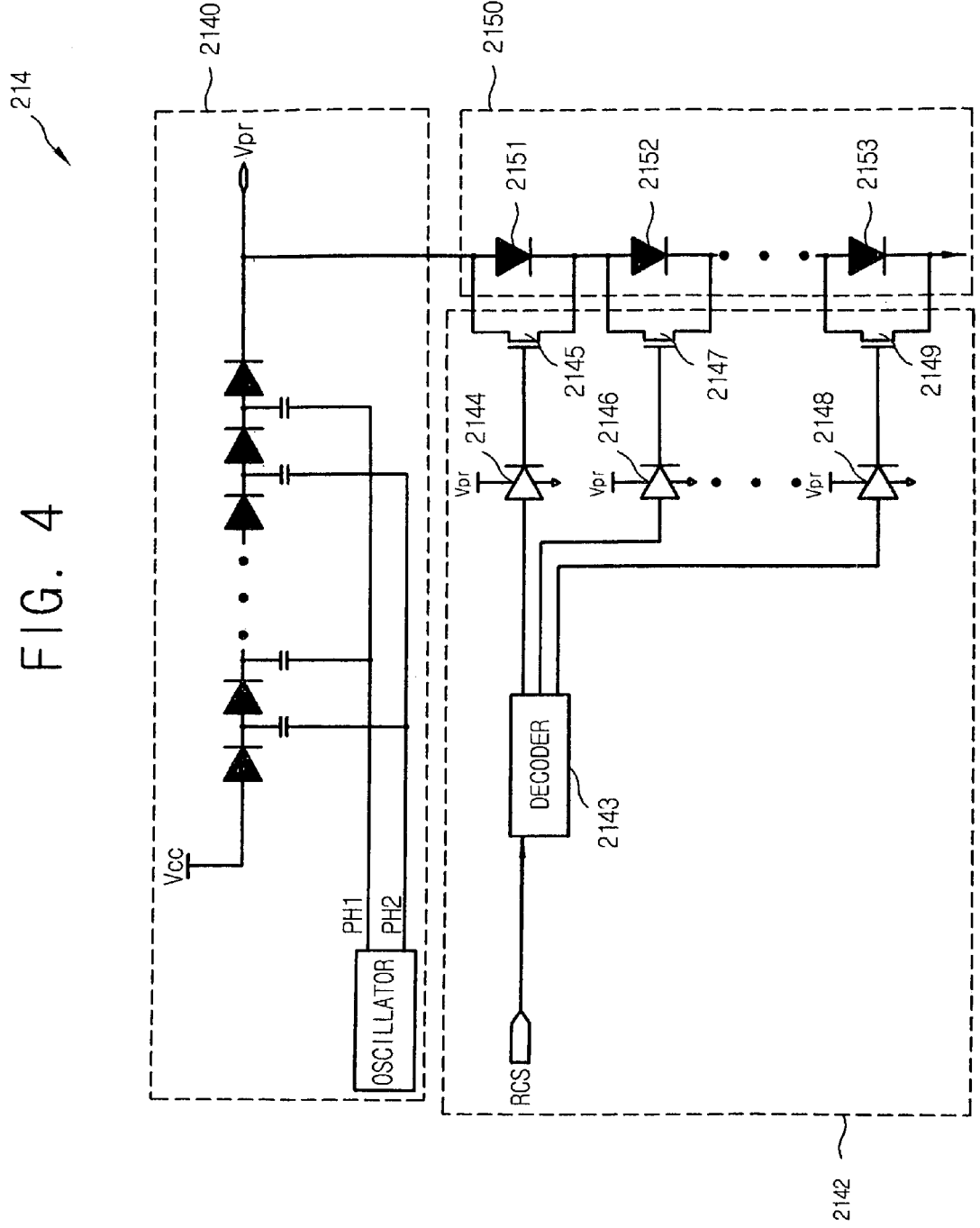
FIG. 4 is a circuit diagram of a read voltage pump shown in FIG. 2.

FIG. 4 is a circuit diagram of the read voltage pump 214 shown in FIG. 2. Referring to FIG. 4, the read voltage pump 214 includes a pumping circuit 2140, a level control signal generation circuit 2142, and a read voltage level control circuit 2150. Those of ordinary skill in the art will understand the structure and functions of the circuits 2140, 2142, and 2150 referring to the structure and functions of the circuits 2120, 2122, and 2130 illustrated in FIG. 3, and thus detailed descriptions thereof will be omitted.

The pumping circuit 2140 pumps the power supply voltage Vcc to generate the read voltage Vpr higher than the power supply voltage Vcc. The level control signal generation circuit 2142 generates control signals to turn transistors 2145 through 2149 on or off, respectively, in response to the read voltage control signal RCS. The read voltage level control circuit 2150 controls the level of the read voltage Vpr generated by the pumping circuit 2140 in response to the control signals.

The voltage control circuit 210 detects an operational characteristic of the EEPROM cells of the normal non-volatile memory area 204 and outputs the write voltage control signal WCS to determine the level of the write voltage Vpp and/or the read voltage control signal RCS to determine the level of the read voltage Vpr, based on a detection result. The voltage control circuit 210 includes a write/read voltage information storage area 216, a first information storage area 218, an endurance information storage area 220, a bus 222, and a controller 224. In FIG. 2, the non-volatile memory apparatus 202 includes the controller 224. The controller 224 may be implemented as a peripheral device outside the non-volatile memory apparatus 202.

The write/read voltage information storage area 216 stores information on the write voltage Vpp needed to write data to the areas 204, 216, 218, and 220, and stores information on the read voltage Vpr needed to read data from the areas 204, 216, 218, and 220.

The first information storage area 218 stores first information indicating the characteristic (e.g., the read time or speed) of first non-volatile memory cells that have not been degraded due to read endurance or the number of data updates. The first information indicating the characteristic of the first non-volatile memory cells is written to the first information storage area 218 upon the examination of the non-volatile memory apparatus 202 or the SOC 200.

The endurance information storage area 220 stores a result of monitoring the operational characteristic of EEPROM cells of the normal non-volatile memory area 204. Whenever the non-volatile memory apparatus 202 or the integrated circuit card 200 is reset and initialized, the first information is written to EEPROM cells of the endurance information storage area 220, and therefore, the EEPROM cells are degraded due to a write operation.

The first information is written to the endurance information storage area 220 for each data update (e.g., erase and program operations) occurring in the normal non-volatile memory area 204. Accordingly, the degree of degradation of EEPROM cells of the normal non-volatile memory area 204 is the same as that of EEPROM cells of the endurance information storage area 220. The EEPROM cells of the endurance information storage area 220 are used for monitoring the degree of degradation of the EEPROM cells of the normal non-volatile memory area 204.

Information is input and output between the controller 224 and each of the write/read voltage information storage area 216, the first information storage area 218, and the endurance information storage area 220 through the bus 222.

The controller 224 may be implemented inside or outside the non-volatile memory apparatus 202. The controller 224 generates the write voltage control signal WCS and/or the read voltage control signal RCS based on the information on the write voltage Vpp and/or the information on the read voltage Vpr.

The controller 224 compares a characteristic indicated by the first information read from the first information storage area 218 in response to the read voltage Vpr generated by the read voltage pump 214 with a characteristic indicated by the first information read from the endurance information storage area 220 in response to the read voltage Vpr and controls at least one of the information on the write voltage Vpp and the information on the read voltage Vpr based on a comparison result. The controller 224 is reset in response to a reset signal RESET.

Figure 5:
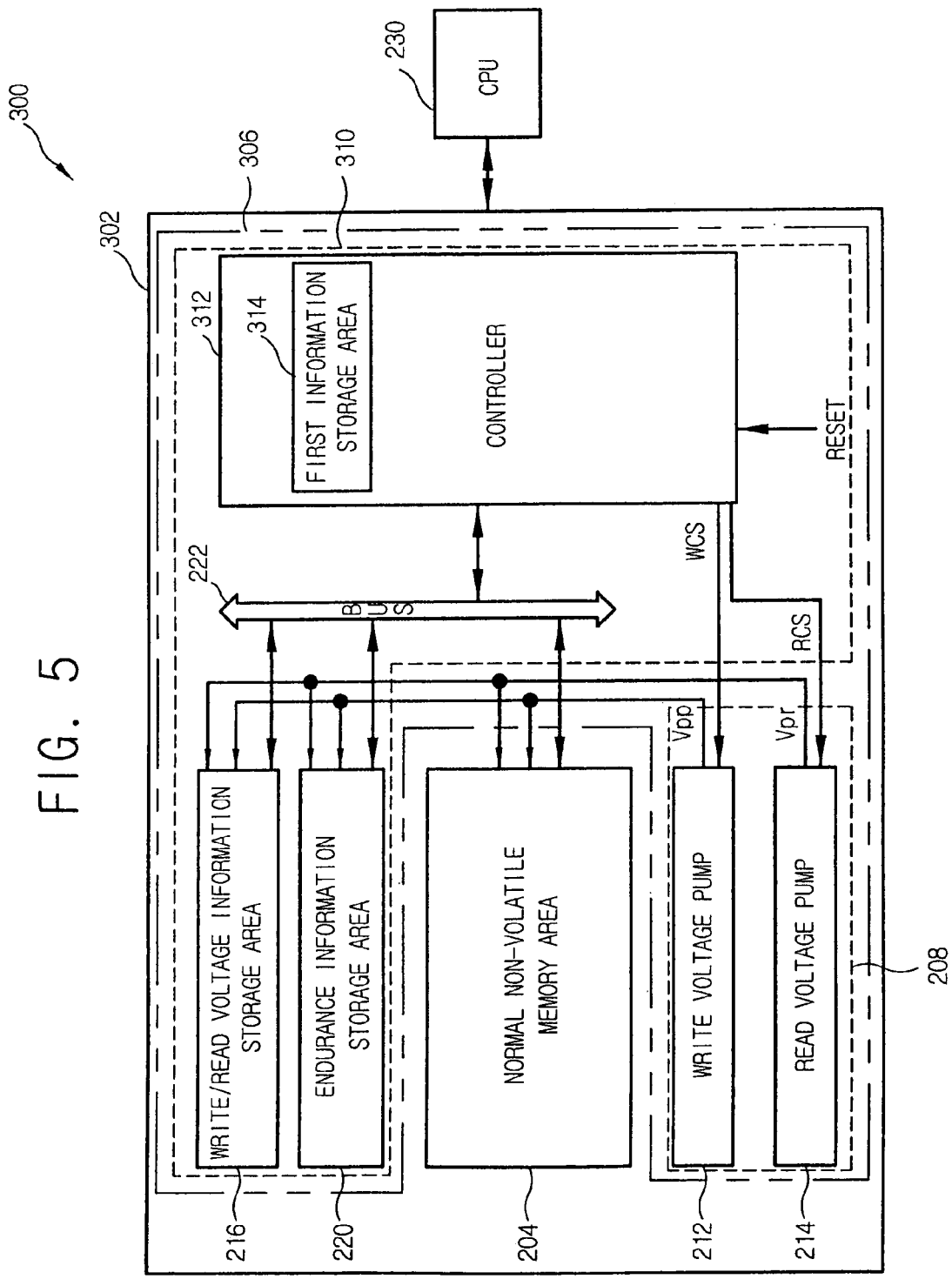
FIG. 5 is a block diagram of an SOC including an EEPROM cell, according to an embodiment of the present invention.

FIG. 5 is a block diagram of an SOC, e.g., integrated circuit card 300 including an EEPROM cell according to an embodiment of the present invention. Referring to FIG. 5, the integrated circuit card 300 includes a non-volatile memory apparatus 302 and a CPU 230. The non-volatile memory apparatus 302 include a normal non-volatile memory area 204 and an endurance improving circuit 306. The endurance improving circuit 306 includes a voltage generation circuit 208 and the voltage control circuit 310.

The voltage control circuit 310 includes a write/read voltage information storage area 216, an endurance information storage area 220, a bus 222, and a controller 312. The controller 312 includes a first information storage area 314.

Referring to FIG. 5, the non-volatile memory apparatus 302 includes the controller 312. The controller 312 may be implemented as a peripheral device outside the non-volatile memory apparatus 302.

The controller 312, which may be implemented inside or outside the non-volatile memory apparatus 302, stores first information indicating the characteristic of first non-volatile memory, or first non-volatile memory cells, that have not been degraded and generates the write voltage control signal WCS and/or the read voltage control signal RCS based on information on the write voltage Vpp and information on the read voltage Vpr.

The controller 312 compares a characteristic indicated by first information indicating the characteristic of first non-volatile memory that is not initialized by a reset operation with a characteristic indicated by first information read from the endurance information storage area 220 in response to the read voltage Vpr.

The controller 312 changes at least one of the information on the write voltage Vpp and the information on the read voltage Vpr base on a comparison result and writes the changed information to the write/read voltage information storage area 216.

The controller 224 or 312 can control the number of changes in the information on the write voltage Vpp and/or the number of changes in the information on the read voltage Vpr. Accordingly, the integrated circuit cards 200 and 300 can prevent an infinite loop that may occur due to an erroneous operation of the endurance improving circuits 206 and 306, respectively.

Figure 6:
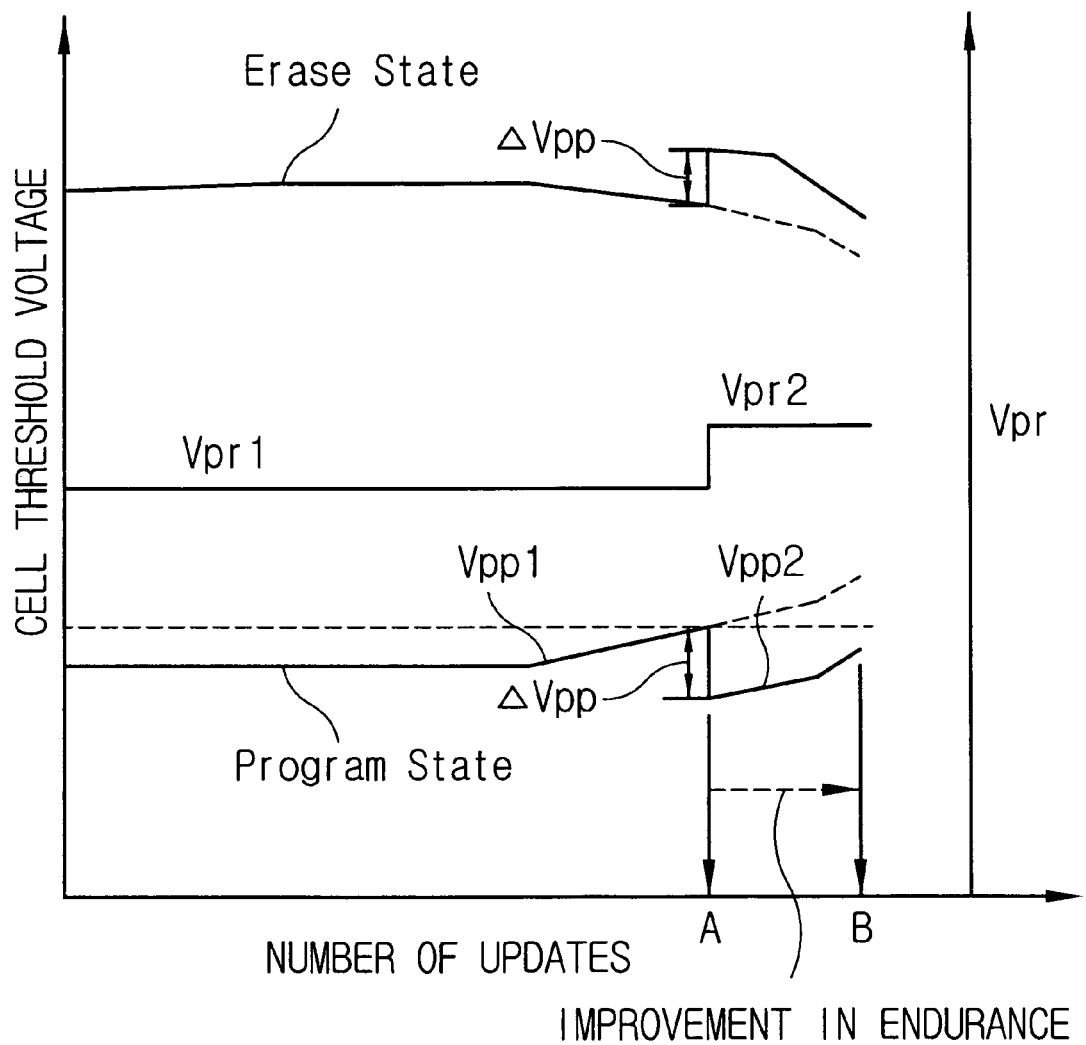
FIG. 6 illustrates the number of updates versus the threshold voltage in EEPROM cells in the SOCs respectively according to an embodiment of the present invention.

FIG. 6 illustrates the number of updates versus the threshold voltage in EEPROM cells in the SOCs according to the devices of FIG. 2 and FIG. 5.

Referring to FIG. 6, since the threshold voltage of EEPROM cells in the normal non-volatile memory area 204 gradually increases until the number of data updates or write cycles reaches "A", current sensing data stored in the EEPROM cells gradually decreases. As the current decreases, time taken to read data from the normal non-volatile memory area 204 increases.

The integrated circuit cards 200 and 300 sense the degree of degradation of the EEPROM cells of the normal non-volatile memory area 204, increases a first write voltage Vpp1 applied to the normal non-volatile memory area 204 by a voltage of ΔVpp to a second write voltage Vpp2, and applies the second write voltage Vpp2 to the normal non-volatile memory area 204. Accordingly, the threshold voltage of the EEPROM cells, which has increased due to an increase in the number of data updates or write cycles, decreases by the voltage of ΔVpp in the normal non-volatile memory area 204. As a result, the integrated circuit cards 200 and 300 can increase the number of data updates or write cycles to "B".

In detail, when data is written to corresponding EEPROM cells of the normal non-volatile memory area 204, the write voltage pump 212 generates the first voltage Vpp1 higher than the power supply voltage Vcc. The data is written to the EEPROM cells in the normal non-volatile memory area 204 using FN tunneling. When the write voltage Vpp is increased from the first write voltage Vpp1 to the second write voltage Vpp2, a characteristic of reading data from the EEPROM cells in the normal non-volatile memory area 204 is improved. Accordingly, write endurance can be improved from "A" to "B".

If a word line voltage, e.g., the read voltage Vpr, is increased from a first read voltage Vpr1 to a second read voltage Vpr2 when data is read from the EEPROM cells in the normal non-volatile memory area 204, current sensing the data stored in the EEPROM directly increases. As a result, a characteristic of reading data from the EEPROM cells is improved.

The integrated circuit cards 200 and 300 generate the first read voltage Vpr1 before the EEPROM cells in the normal non-volatile memory area 204 are degraded and generate the second read voltage Vpr2 thereafter, thereby improving read endurance from "A" to "B".

Figure 7:
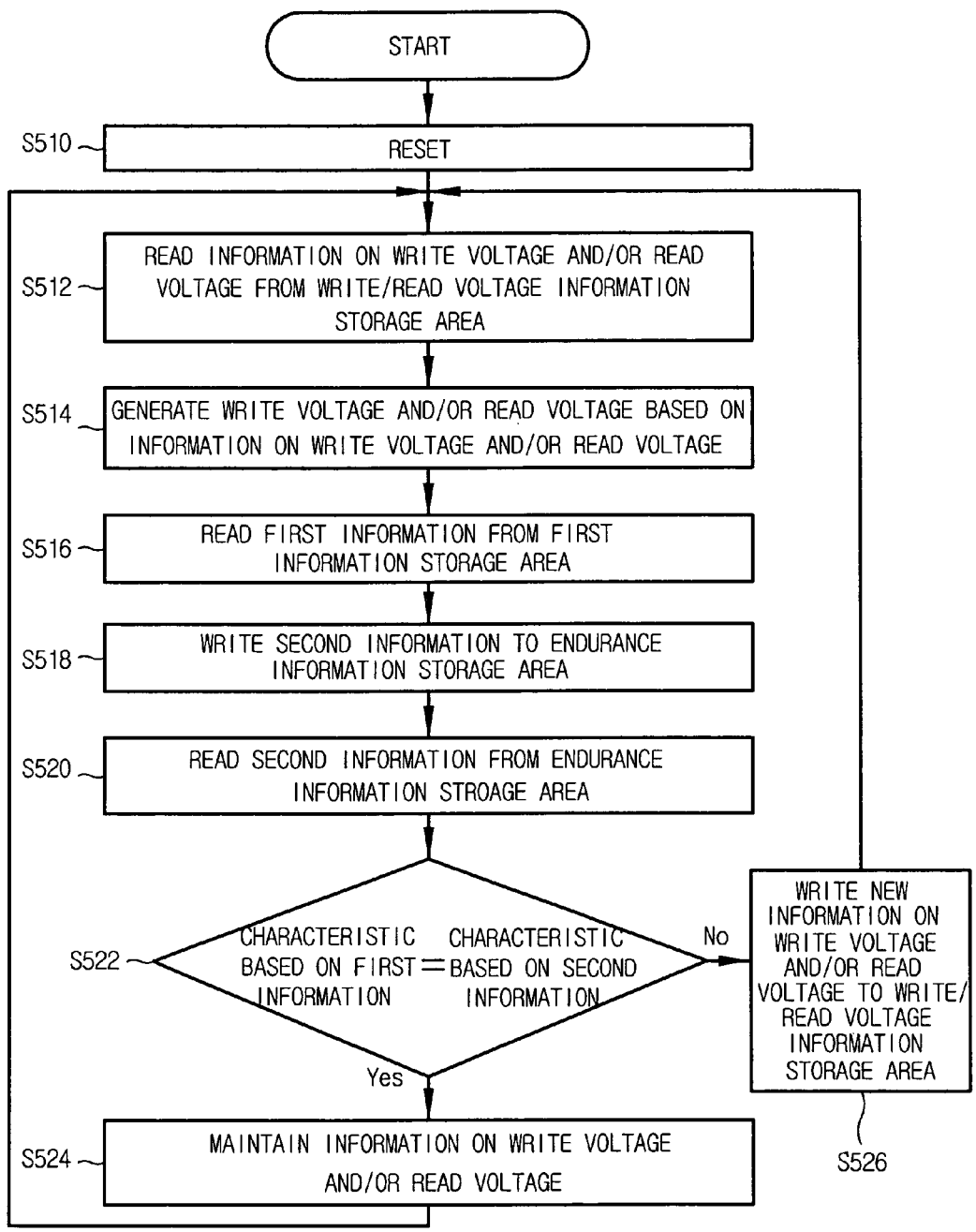
FIG. 7 is a flowchart of a method of operating an SOC including an EEPROM cell, according to an embodiment of the present invention.

FIG. 7 is a flowchart of a method of operating a SOC including an EEPROM cell, according to an embodiment of the present invention. A method of improving write/read endurance of non-volatile memory in an SOC (or the integrated circuit cards 200 or 300) including the non-volatile memory, or non-volatile memory cells, will be described in detail with reference to FIGS. 2 through 7.

In operation S510, the integrated circuit card 200 or 300 is reset in response to the reset signal RESET. In block S512, the controller 224 or 312 reads information on the write voltage Vpp and/or information on the read voltage Vpr from the write/read voltage information storage area 216 through the bus 222.

The controller 224 or 312 outputs the write voltage control signal WCS and/or the read voltage control signal RCS to the write voltage pump 212 and/or the read voltage pump 214, respectively, in response to the information on the write voltage Vpp and/or the information on the read voltage Vpr.

In block S514, the write voltage pump 212 generates the first write voltage Vpp1 in response to the write voltage control signal WCS and the read voltage pump 214 generates the first read voltage Vpr1 in response to the read voltage control signal RCS.

In block S516, the controller 224 or 312 reads first information from the first information storage area 218 or 314 using the first read voltage Vpr1.

The controller 224 or 312 writes second information to the endurance information storage area 220 based on the first write voltage Vpp1 in block S518 and reads the second information from the endurance information storage area 220 using the first read voltage Vpr1 in block S520.

In block S522, the controller 224 or 312 compares a characteristic indicated by the first information read from the first information storage area 218 or 314 with a characteristic indicated by the second information read from the endurance information storage area 220.

If it is determined that the characteristics are the same (for example, if time taken to read the first information from the first information storage area 218 or 314 and time taken to read the second information from the endurance information storage area 220 are substantially the same or a difference there between is within a range tolerated by specifications) in block S522, the controller 224 or 312 maintains the information on the write voltage Vpp and/or the information on the read voltage Vpr stored in the write/read voltage information storage area 216 in block S524. When the integrated circuit card 200 or 300 is reset and initialized, the write voltage pump 212 generates the first write voltage Vpp1 and the read voltage pump 214 generates the first read voltage Vpr1.

If it is determined that the characteristics are not the same (for example, if a difference between time taken to read the first information from the first information storage area 218 or 314 and time taken to read the second information from the endurance information storage area 220 is out of a range defined by a specification) in block S522, the controller 224 or 312 updates the information on the first write voltage Vpp1 and/or the information on the first read voltage Vpr1 with information on the second write voltage Vpp2 and information on the second read voltage Vpr2 in the write/read voltage information storage area 216 in block S526.

When the integrated circuit card 200 or 300 is reset and initialized, the write voltage pump 212 generates the second write voltage Vpp2 and/or the read voltage pump 214 generates the second read voltage Vpr2.

Figure 8:
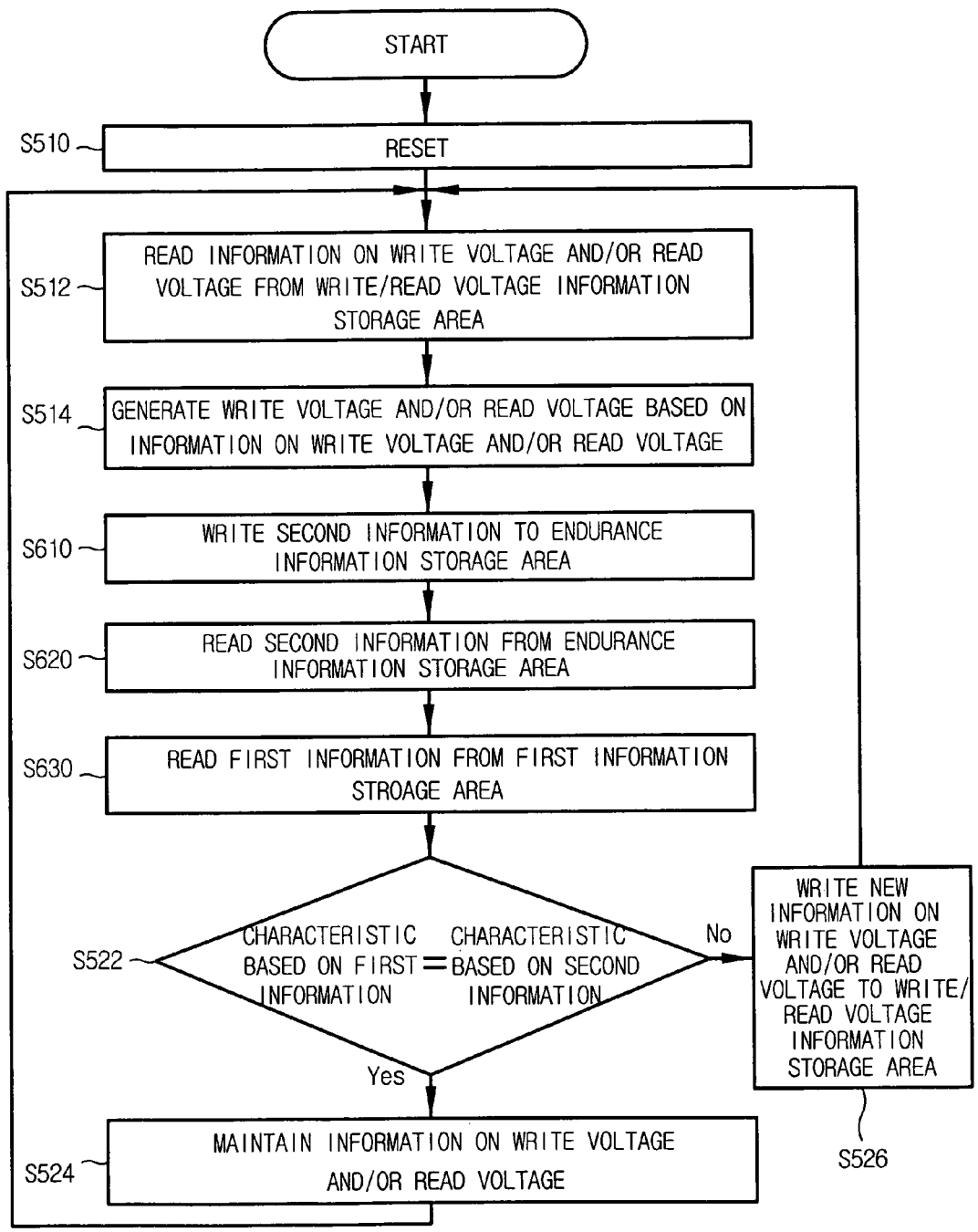
FIG. 8 is a flowchart of a method of operating an SOC including an EEPROM cell, according to another embodiment of the present invention.

FIG. 8 is a flowchart of a method of operating the SOC, e.g., the integrated circuit card 200 or 300 including an EEPROM cell, according to an embodiment of the present invention. Referring to FIG. 8, the controller 224 or 312 writes second information to the endurance information storage area 220 based on the first write voltage Vpp1 in block S610, reads the second information from the endurance information storage area 220 using the first read voltage Vpr1 in block S620, and reads first information from the first information storage area 218 or 314 using the first read voltage Vpr1 in block S630.

Figure 9:
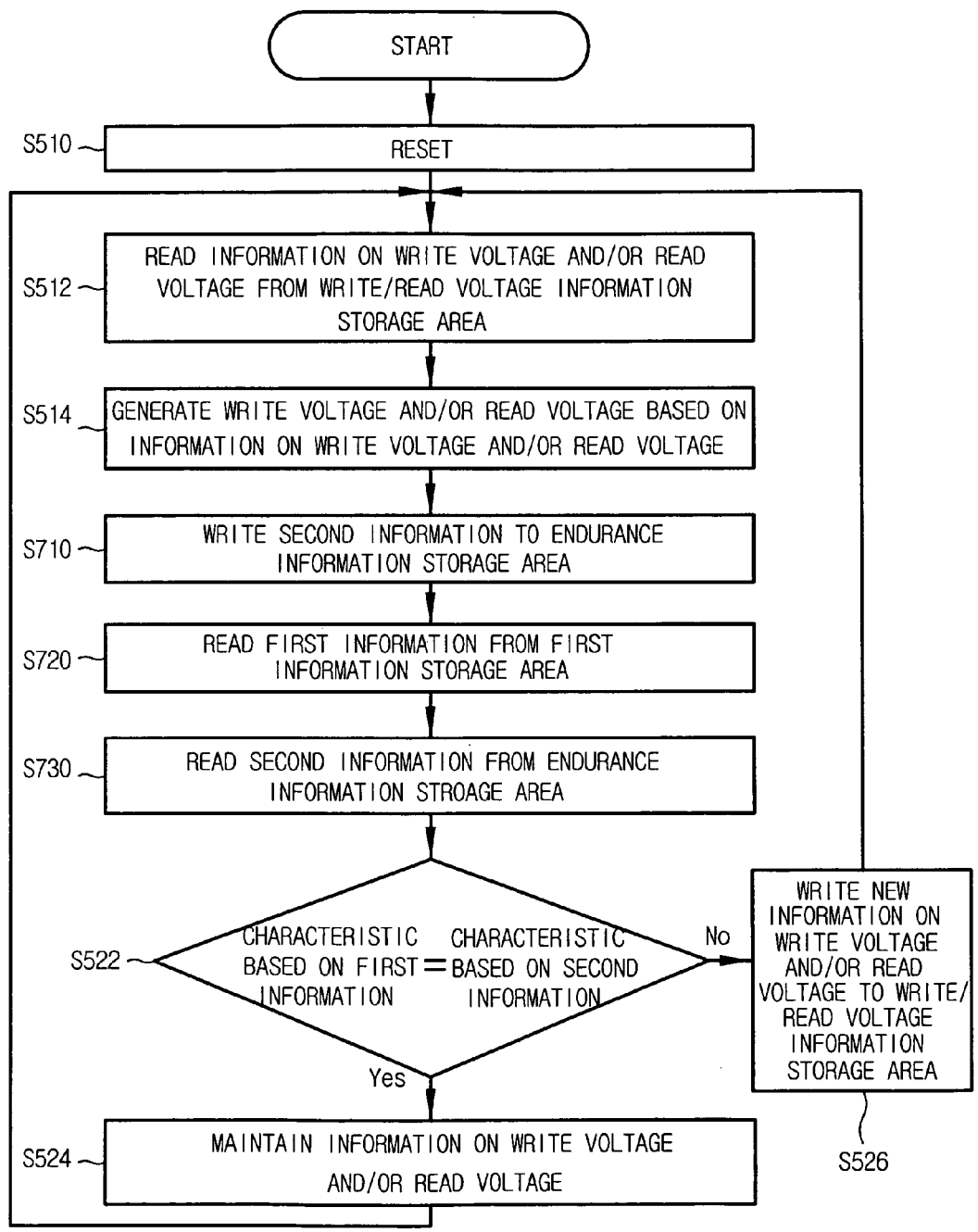
FIG. 9 is a flowchart of a method of operating an SOC including an EEPROM cell, according to still another embodiment of the present invention.

FIG. 9 is a flowchart of a method of operating an SOC, e.g., the integrated circuit card 200 or 300 including an EEPROM cell, according to an embodiment of the present invention. Referring to FIG. 9, the controller 224 or 312 writes second information to the endurance information storage area 220 based on the first write voltage Vpp1 in block S710, reads first information from the first information storage area 218 or 314 using the first read voltage Vpr1 in block S720, and reads the second information from the endurance information storage area 220 using the first read voltage Vpr1 in block S730.

As illustrated in FIGS. 2 through 9, when the EEPROM cells in the normal non-volatile memory area 204 are degraded, the integrated circuit cards 200 and 300 increase at least one of the write voltage Vpp and the read voltage Vpr to increase read endurance.

Embodiments of the present invention can be written as a computer program stored on computer readable recording medium and can be implemented by a general-use digital computer that executes the program stored on the computer readable recording medium.

According to the present invention, an integrated circuit card including a non-volatile memory apparatus increases at least one of a write voltage and a read voltage, which are applied to the non-volatile memory apparatus when the non-volatile memory apparatus is degraded due to repetition of a data update in order to increase write/read endurance of the non-volatile memory apparatus.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. An integrated circuit card comprising:
a non-volatile memory area including a plurality of non-volatile memory cells to store data; and
an endurance improving circuit detecting a characteristic of the non-volatile memory cells upon the integrated circuit card being reset and initialized, and maintaining or increasing at least one of a write voltage used to write first data to the non-volatile memory cells and a read voltage used to read second data from the non-volatile memory cells based on a detection result.

2. The integrated circuit card of claim 1, wherein the endurance improving circuit comprises:
a voltage generation circuit generating at least one of the write voltage used to write the first data to the non-volatile memory cells in response to a write voltage control signal and the read voltage used to read the second data from the non-volatile memory cells in response to a read voltage control signal; and
a voltage control circuit detecting the characteristic of the non-volatile memory cells and outputting at least one of the write voltage control signal and the read voltage control signal based on the detection result.

3. The integrated circuit card of claim 2, wherein the voltage generation circuit comprises:
a write voltage pump generating a first plurality of voltages and outputting one voltage of the first plurality of voltages as the write voltage according to the write voltage control signal; and
a read voltage pump generating a second plurality of voltages and outputting one voltage among the second plurality of voltages as the read voltage according to the read voltage control signal.

4. The integrated circuit card of claim 3, wherein the voltage control circuit comprises:
a write/read voltage information storage area storing information on the write voltage and information on the read voltage;
a first information storage area storing first information indicating the characteristic of a first non-volatile memory;
an endurance information storage area including a second non-volatile memory to which the first information is written upon the integrated circuit card being initialized; and
a controller generating at least one of the write voltage control signal and the read voltage control signal based on at least one of the information on the write voltage and the information on the read voltage,
the controller comparing the characteristic indicated by the first information read from the first information storage area in response to the read voltage with the characteristic indicated by the first information read from the endurance information storage area in response to the read voltage and maintains or updates at least one of the information on the write voltage and the information on the read voltage based on a comparison result.

5. The integrated circuit card of claim 4, wherein the characteristic indicated by the first information is one of a read time and a read speed.

6. The integrated circuit card of claim 4, wherein the controller controls at least one of a number of updates of the information on the write voltage and a number of updates of the information on the read voltage.

7. The integrated circuit card of claim 3, wherein the voltage control circuit comprises:
a write/read voltage information storage area storing information on the write voltage and information on the read voltage;
a controller storing first information indicating the characteristic of first non-volatile memory and generating the write voltage control signal and/or the read voltage control signal based on the information on the write voltage and/or the information on the read voltage; and
an endurance information storage area including second non-volatile memory to which the first information is written whenever the integrated circuit card is initialized,
the controller comparing the characteristic indicated by the first information indicating the characteristic of the first non-volatile memory with the characteristic indicated by the first information read from the endurance information storage area in response to the read voltage and maintains or updates at least one of the information on the write voltage and the information on the read voltage based on a comparison result.

8. An integrated circuit card comprising:
a non-volatile memory area including a plurality of non-volatile memory cells to store data; and
an endurance improving circuit receiving first information indicating an initial state of the plurality of non-volatile memory cells, receiving second information indicating a state of the non-volatile memory cells upon the integrated circuit card being reset and initialized, comparing the first information with the second information, and maintaining or increasing at least one of a write voltage and a read voltage, which are applied to the non-volatile memory area based on a comparison result.

9. The integrated circuit card of claim 8, wherein the endurance improving circuit comprises:
- a voltage generation circuit generating at least one of the write voltage used to write first data to the non-volatile memory cells in response to a write voltage control signal and the read voltage used to read second data from the non-volatile memory cells in response to a read voltage control signal; and
- a voltage control circuit comparing the first information with the second information and generating at least one of the write voltage control signal and the read voltage control signal based on a comparison result.

10. The integrated circuit card of claim 9, wherein the voltage control circuit comprises:
- a write/read voltage information storage area storing information on the write voltage and information on the read voltage;
- a first information storage area storing the first information;
- an endurance information storage area storing the second information; and
- a controller generating at least one of the write voltage control signal and the read voltage control signal based on at least one of the information on the write voltage and the information on the read voltage,
- the controller comparing a characteristic indicated by the first information read in response to the read voltage with the characteristic indicated by the second information read in response to the read voltage and maintains or updates at least one of the information on the write voltage and the information on the read voltage based on the comparison result.

11. The integrated circuit card of claim 9, wherein the voltage control circuit comprises:
- a write/read voltage information storage area storing information on the write voltage and information on the read voltage;
- a controller storing the first information and generating at least one of the write voltage control signal and the read voltage control signal based on at least one of the information on the write voltage and the information on the read voltage; and
- an endurance information storage area storing the second information,
- the controller comparing a characteristic indicated by the first information read in response to the read voltage with the characteristic indicated by the second information read in response to the read voltage and maintains or updates at least one among the information on the write voltage and the information on the read voltage based on the comparison result.

12. A semiconductor apparatus comprising:
- a normal non-volatile memory area including a plurality of non-volatile memory cells to store data;
- a write/read voltage information storage area storing information on a write voltage and information on a read voltage, which are received from an external controller;
- a first information storage area storing first information indicating a characteristic of first non-volatile memory;
- an endurance information storage area including second non-volatile memory to which the first information is written upon the semiconductor apparatus being initialized by control of the external controller;
- a write voltage pump generating a plurality of voltages and outputting one voltage of the plurality of voltages as the write voltage according to a write voltage control signal received from the controller; and
- a read voltage pump generating a plurality of voltages and outputting one voltage of the plurality of voltages as the read voltage according to a read voltage control signal received from the controller,
- wherein the write voltage and the read voltage are input to at least one area of the normal non-volatile memory area, the write/read voltage information storage area, the first information storage area, and the endurance information storage area.

13. A method of improving write/read endurance of non-volatile memory in a system on chip including the non-volatile memory, the method comprising:
- receiving first information indicating a characteristic of first non-volatile memory that has not been degraded and second information indicating the characteristic of second non-volatile memory that has been degraded due to one of a write operation and read operation executed in response to one of a write voltage and a read voltage, respectively, and comparing the first information with the second information; and
- increasing at least one voltage of the write voltage and the read voltage based on a comparison result.

14. The method of claim 13, wherein each of the first information and the second information is one of a read time and a read speed.

15. The method of claim 13, further comprising:
- storing the first information in a first area of the non-volatile memory;
- writing the second information to a second area of the non-volatile memory upon the system on chip being initialized; and
- reading the first information and the second information in response to the read voltage.

16. A method of improving write/read endurance of non-volatile memory in an integrated circuit card including the non-volatile memory, the method comprising:
- storing first information in a first area of the non-volatile memory;
- reading at least one of information on a write voltage and information on a read voltage;
- generating at least one voltage of the read voltage and the write voltage based on the at least one of the information on the write voltage and the information on the read voltage;
- reading the first information from the first area using the read voltage;
- writing the first information to a second area of the non-volatile memory in response to the write voltage upon the integrated circuit card being initialized;
- reading the first information from the second area in response to the read voltage;
- comparing a characteristic indicated by the first information from the first area with the characteristic indicated by the first information from the second area; and
- changing at least one of the information on the write voltage and the information on the read voltage based on a comparison result.

* * * * *